US009214790B2

(12) United States Patent
Zheng et al.

(10) Patent No.: US 9,214,790 B2
(45) Date of Patent: Dec. 15, 2015

(54) FILTERED LASER ARRAY ASSEMBLY WITH EXTERNAL OPTICAL MODULATION AND WDM OPTICAL SYSTEM INCLUDING SAME

(71) Applicant: Applied Optoelectronics, Inc., Sugar Land, TX (US)

(72) Inventors: Jun Zheng, Missouri City, TX (US); Stefan Murry, Houston, TX (US); Wen-Yen Hwang, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 45 days.

(21) Appl. No.: 13/644,113

(22) Filed: Oct. 3, 2012

(65) Prior Publication Data

US 2014/0093244 A1  Apr. 3, 2014

(51) Int. Cl.
*H04B 10/12* (2006.01)
*H01S 3/08* (2006.01)
(Continued)

(52) U.S. Cl.
CPC ........... *H01S 5/4062* (2013.01); *H04J 14/0254* (2013.01); *H04J 14/0279* (2013.01); *H04J 14/0282* (2013.01); *H01S 5/4087* (2013.01)

(58) Field of Classification Search
CPC .. H01S 5/4062; H01S 5/4087; H04J 14/0282; H04J 14/0279; H04J 14/0254
USPC .......................... 398/43, 66, 68–73, 182–201; 372/92–108
See application file for complete search history.

(56) References Cited

U.S. PATENT DOCUMENTS 5,790,287 A * 8/1998 Darcie et al. ................. 398/108
5,946,331 A    8/1999 Amersfoort et al.
(Continued)

FOREIGN PATENT DOCUMENTS

EP   2337240 A1   6/2011
WO   2006116477 A2   11/2006
WO   2013010166 A1   1/2013

OTHER PUBLICATIONS

Harvey et al , External cavity diode laser using a grazing-incidence diffraction grating, Jan. 1991, Optic Letters, vol. 16 No. 2, All document.*

(Continued)

*Primary Examiner* — Ken Vanderpuye
*Assistant Examiner* — Dibson Sanchez
(74) *Attorney, Agent, or Firm* — Grossman Tucker Perreault & Pfleger, PLLC; Norman S. Kinsella (57) ABSTRACT

A filtered laser array assembly generally includes an array of laser emitters coupled between external modulators and an arrayed waveguide grating (AWG). Each of the laser emitters emits light across a plurality of wavelengths including, for example, channel wavelengths in an optical communication system. The AWG filters the emitted light from each of the laser emitters at different channel wavelengths associated with each of the laser emitters. Lasing cavities are formed between each of the laser emitters and a back reflector coupled to an output of the AWG such that laser output from the laser emitters is provided at the respective channel wavelengths of the reflected, filtered light. The external modulators enable high speed modulation of the laser output. The modulated laser output may then be optically multiplexed to produce an aggregate optical signal including multiple channel wavelengths.

21 Claims, 3 Drawing Sheets

(51) Int. Cl.
*H01S 5/40* (2006.01)
*H04J 14/02* (2006.01)

(56) References Cited

U.S. PATENT DOCUMENTS

| | | | | |
|---|---|---|---|---|
| 6,055,250 | A * | 4/2000 | Doerr et al. | 372/23 |
| 6,091,743 | A * | 7/2000 | Yang | 372/6 |
| 6,212,209 | B1 * | 4/2001 | Delavaux | 372/10 |
| 6,295,308 | B1 * | 9/2001 | Zah | 372/50.1 |
| 6,434,175 | B1 * | 8/2002 | Zah | 372/20 |
| 6,529,542 | B1 | 3/2003 | Karlsen et al. | |
| 6,661,814 | B1 * | 12/2003 | Chapman et al. | 372/6 |
| 7,123,406 | B2 * | 10/2006 | Shin et al. | 359/344 |
| 7,257,283 | B1 * | 8/2007 | Liu et al. | 385/14 |
| 7,313,157 | B2 * | 12/2007 | Sorin et al. | 372/50.1 |
| 7,965,949 | B1 | 6/2011 | Wach | |
| 8,422,124 | B2 * | 4/2013 | Lee et al. | 359/349 |
| 8,463,088 | B1 * | 6/2013 | Asghari et al. | 385/14 |
| 8,559,821 | B2 * | 10/2013 | Wen et al. | 398/79 |
| 8,606,107 | B2 * | 12/2013 | Bai et al. | 398/70 |
| 8,971,709 | B2 * | 3/2015 | Liu et al. | 398/67 |
| 2001/0017960 | A1 | 8/2001 | Terahara | |
| 2002/0154661 | A1 | 10/2002 | Hoose et al. | |
| 2004/0067059 | A1 * | 4/2004 | Song et al. | 398/82 |
| 2004/0076199 | A1 * | 4/2004 | Wipiejewski et al. | 372/26 |
| 2004/0190565 | A1 * | 9/2004 | Thourhout | 372/20 |
| 2005/0078359 | A1 * | 4/2005 | Kim et al. | 359/344 |
| 2005/0135449 | A1 | 6/2005 | Sorin et al. | |
| 2005/0185262 | A1 * | 8/2005 | Yun et al. | 359/344 |
| 2005/0213618 | A1 * | 9/2005 | Sochava et al. | 372/20 |
| 2006/0115271 | A1 * | 6/2006 | Hwang et al. | 398/72 |
| 2006/0171428 | A1 | 8/2006 | Volodin | |
| 2006/0215713 | A1 | 9/2006 | Flanders et al. | |
| 2006/0256831 | A1 | 11/2006 | Volodin et al. | |
| 2007/0047608 | A1 | 3/2007 | Volodin et al. | |
| 2007/0133647 | A1 | 6/2007 | Daiber | |
| 2007/0223552 | A1 | 9/2007 | Muendel et al. | |
| 2008/0259972 | A1 | 10/2008 | Heanue et al. | |
| 2008/0267246 | A1 | 10/2008 | Volodin et al. | |
| 2008/0279557 | A1 * | 11/2008 | Park et al. | 398/79 |
| 2009/0074019 | A1 | 3/2009 | Wong et al. | |
| 2009/0154939 | A1 | 6/2009 | Kim et al. | |
| 2009/0245799 | A1 | 10/2009 | Habel et al. | |
| 2010/0266283 | A1 | 10/2010 | Beckett | |
| 2010/0316378 | A1 * | 12/2010 | Yeh et al. | 398/58 |
| 2011/0033192 | A1 | 2/2011 | Daiber et al. | |
| 2011/0038635 | A1 * | 2/2011 | Bai | 398/82 |
| 2011/0135309 | A1 | 6/2011 | Lee et al. | |
| 2011/0216789 | A1 * | 9/2011 | Docter et al. | 372/20 |
| 2011/0222855 | A1 * | 9/2011 | Kim et al. | 398/79 |
| 2012/0087667 | A1 * | 4/2012 | Bulthuis | 398/79 |
| 2013/0058648 | A1 * | 3/2013 | Ji et al. | 398/38 |
| 2013/0089322 | A1 | 4/2013 | Ohlen | |

OTHER PUBLICATIONS

Lee, San-Liang et al, "Trend and Applications of Tunable Semiconductor Lasers", Optoelectronic Materials and Devices II, Proc. of SPIE vol. 6782, 67821H, 2007, Taipei, Taiwan R.O.C., 10 pgs.

PCT International Search Report and Written Opinion dated Oct. 22, 2012 received in related PCT Application No. PCT/US2012/046912, 8 pgs.

PCT International Search Report and Written Opinion dated Dec. 30, 2013 received in related PCT Application No. PCT/US2013/063213, 8 pgs.

US Office Action mailed Aug. 9, 2013, received in related U.S. Appl. No. 13/359,847, 15 pgs.

PCT International Search Report and Written Opinion dated Oct. 5, 2012 received in related PCT Application No. PCT/US2012/046902, 9 pgs.

US Office Action mailed Feb. 10, 2014, received in related U.S. Appl. No. 13/359,847, 16 pgs.

US Office Action mailed Apr. 24, 2014, received in related U.S. Appl. No. 13/539,961, 31 pgs.

US Office Action mailed Aug. 15, 2014, received in related U.S. Appl. No. 13/539,961, 16 pgs.

US Office Action mailed Nov. 7, 2014, received in related U.S. Appl. No. 13/357,130, 18 pgs.

English language European Extended Search Report dated Mar. 13, 2015, received in related EPO Application No. 12811401.4, 8 pgs.

English language European Extended Search Report dated Jun. 23, 2015, received in related EPO Application No. 12811021.0, 6 pgs.

* cited by examiner

FILTERED LASER ARRAY ASSEMBLY WITH EXTERNAL OPTICAL MODULATION AND WDM OPTICAL SYSTEM INCLUDING SAME

TECHNICAL FIELD

The present disclosure relates to wavelength division multiplexed (WDM) optical systems, networks, and methods and more particularly, to a filtered laser array assembly with external modulation, which is configured to provide multiple different channel wavelengths and high speed modulation.

BACKGROUND INFORMATION

Optical communications networks have been deployed for many years. Originally, these networks were generally "point to point" type networks including a transmitter and a receiver connected by an optical fiber. Such networks are relatively easy to construct but deploy many fibers to connect multiple users. As the number of subscribers connected to the network increases, the fiber count also increases rapidly and the expense of deploying and managing many fibers becomes complex and expensive.

A passive optical network (PON) addresses this problem by using a single "trunk" fiber from a transmitting end of the network, such as an optical line terminal (OLT), to a remote branching point, which may be up to 20 km or more. Each subscriber may be connected to the network utilizing a much shorter fiber span forming an architecture sometimes referred to as "tree and branch." One challenge in developing such a PON is utilizing the capacity in the trunk fiber efficiently in order to transmit the maximum possible amount of information on the trunk fiber.

To improve efficiency, PONs have used "time domain multiplexing" by assigning each subscriber on the PON a particular time slot for transmission of its data along the trunk fiber. Each subscriber is allowed to transmit during its assigned time slot, and these slots are synchronized at both the transmitter and receiver such that the receiver knows the time slot (and thus the transmitter) of a transmitted signal. In this way, many transmitters can share the same fiber without fear of multiple transmitters sending data at the same time and confusing the receiver. Standards such as gigabit PON (G-PON) and Ethernet-based PON (E-PON), for example, utilize this time-dependant approach.

Although TDM-PON systems work, the TDM approach is inefficient because the system should allow sufficient time between different transmitter time slots to prevent confusion at the receiving end. Also, noise in this type of system is cumulative across all the transmitters in the PON. To avoid unwanted noise, transmitters other than the one currently transmitting may be turned off and then turned on rapidly when it is time to transmit data, without providing much stabilization time. This "burst mode" transmission makes it challenging to increase data rates in a TDM-PON system.

TDM also does not make efficient use of the bandwidth available on the fiber. Optical fiber has the ability to carry many different signals simultaneously, without interfering, as long as these different signals are carried on different wavelengths. TDM-PON systems utilize only a few wavelengths and therefore do not utilize much of the fundamental bandwidth available on the optical fiber. Similar to radio transmissions utilizing different frequencies to carry different signals, fiber optic communications networks may increase the amount of information carried on a single optical fiber by multiplexing different optical signals on different wavelengths using wavelength division multiplexing (WDM).

In a WDM-PON, a single trunk fiber carries data to and from an optical branching point and the branching point provides a simple routing function by directing signals of different wavelengths to and from individual subscribers. In this case, each subscriber is assigned a particular wavelength on which to send and/or receive data. The WDM-PON thus allows much greater bandwidth because each transmitter is allowed to transmit at a higher data rate and for a longer period of time.

A challenge in a WDM-PON, however, is designing a network that will allow the same transmitter to be used in an optical networking terminal (ONT) at any subscriber location. For ease of deployment and maintenance in a WDM-PON, it is desirable to have a "colorless" ONT whose wavelength can be changed or tuned such that a single device could be used in any ONT on the PON. With a "colorless" ONT, an operator only needs to have a single, universal transmitter or transceiver device that can be employed at any subscriber location.

One or more tunable laser sources may be used to provide multiple optical signals at different wavelengths in a WDM system or network such as a WDM-PON. Similar to a tuner section of a radio transmitter allowing the transmitter to select the frequency on which to transmit, a tunable laser has the capability to select different wavelengths on which to transmit optical signals. Various different types of tunable lasers have been developed over the years, but most of these were developed for high-capacity backbone connections to achieve high performance and at a relatively high cost. Many tunable laser sources rely on continuous tuning mechanisms and may be difficult and expensive to construct because of extremely tight manufacturing tolerances. Many continuously tunable lasers also require an external means to "lock" the wavelength similar to a phase-locked loop or crystal reference oscillator in a radio tuner. These wavelength lockers are used because the continuously tunable designs are often highly sensitive to external conditions that can cause the wavelength to drift if not corrected. Conditions such as temperature or external electrical or magnetic fields, for example, can cause drift in some continuously-tunable laser designs.

Many WDM-PON applications have lower data rates and shorter transmission distances as compared to high-capacity, long-haul WDM systems, and thus a lower performance and lower cost laser may suffice. Also, continuous tuning may not be necessary in WDM-PON applications, although the ability to select a wavelength from among several wavelengths (e.g., in a grid of channel wavelengths) is desirable. In some of these applications, the wavelength may be selected only once in the lifetime of the laser (i.e., when it is initially installed) and this wavelength may not need to be changed again.

BRIEF DESCRIPTION OF THE DRAWINGS

These and other features and advantages will be better understood by reading the following detailed description, taken together with the drawings wherein.

DETAILED DESCRIPTION

A filtered laser array assembly, consistent with embodiments described herein, generally includes an array of laser emitters coupled between external modulators and an arrayed waveguide grating (AWG). Each of the laser emitters emits light across a plurality of wavelengths including, for example, channel wavelengths in an optical communication system. The AWG filters the emitted light from each of the laser emitters at different channel wavelengths associated with each of the laser emitters. Lasing cavities are formed between each of the laser emitters and a back reflector coupled to an output of the AWG such that laser output from the laser emitters is provided at the respective channel wavelengths of the reflected, filtered light. The external modulators enable high speed modulation of the laser output. The modulated laser output may then be optically multiplexed to produce an aggregate optical signal including multiple channel wavelengths.

The filtered laser array assembly with external optical modulation may be used in optical transmitters in a wavelength division multiplexed (WDM) optical system. A filtered laser array assembly with external optical modulation may be used, for example, in an optical line terminal (OLT) in a WDM-PON to combine multiple optical signals at different channel wavelengths. In one example, the filtered laser array assembly with external optical modulation may be used to provide 40 channels, each modulated at 10 Gbps. Alternatively or additionally, a filtered laser array assembly may be used in a tunable transmitter or transceiver in a WDM system such as an optical networking terminal (ONT) or optical networking unit (ONU) in a WDM passive optical network (PON) to select the appropriate transmission channel wavelength(s) for the ONT/ONU.

Laser array assemblies including an array of laser emitters coupled to an AWG may be used to generate optical signals at one or more channel wavelengths, for example, as described in greater detail in co-pending U.S. patent application Ser. No. 13/357,130, which is incorporated herein by reference. Although such laser array assemblies may be advantageous over continuously tunable lasers with complicated external wavelength locking and controls, these laser array assemblies may not be suitable for high speed modulation because of the longer lasing cavities formed between the laser emitters and the reflector at the output of the AWG. The filtered laser array assembly with external modulation, consistent with embodiments described herein, thus allows the advantages of using the AWG to provide filtering and locking at the channel wavelengths while also allowing high speed modulation.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. The term "high speed modulation" or "relatively high speed modulation" refers to optical modulation of the light emitted by the FP laser assembly at a data rate of at least about 1 Gbps. The term "coupled" as used herein refers to any connection, coupling, link or the like by which signals carried by one system element are imparted to the "coupled" element and "optically coupled" refers to coupling such that light from one element is imparted to another element. Such "coupled" devices are not necessarily directly connected to one another and may be separated by intermediate components or devices that may manipulate or modify such signals.

Figure 1:
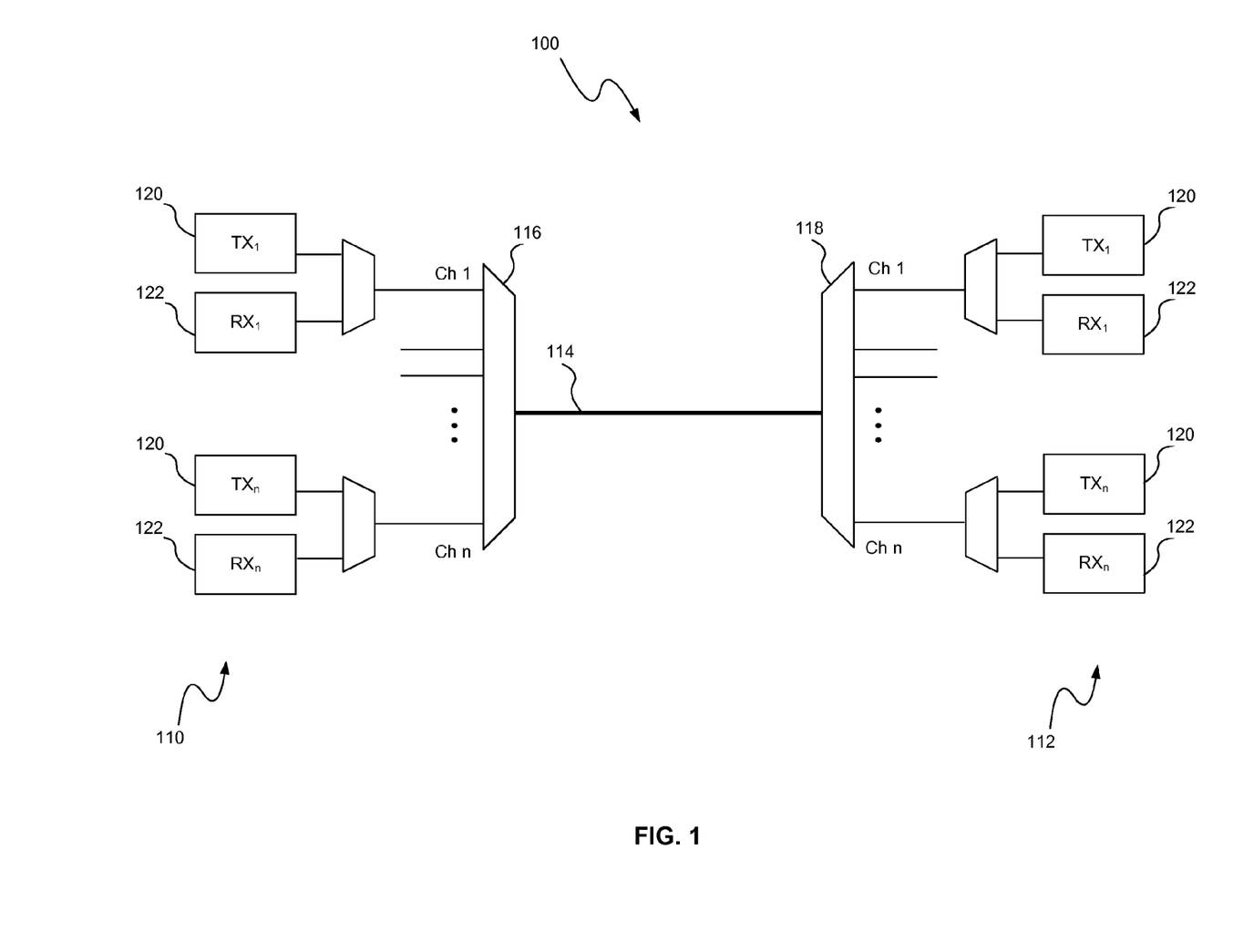
FIG. 1 is a functional block diagram of a wavelength division multiplexed (WDM) optical communication system including one or more filtered laser array assemblies with external optical modulation, consistent with an embodiment of the present disclosure.

Referring to FIG. 1, a WDM optical communication system 100 including one or more filtered laser array assemblies with external optical modulation, consistent with embodiments of the present disclosure, is shown and described. The WDM system 100 includes one or more terminals 110, 112 coupled at each end of a trunk optical fiber or path 114 for transmitting and receiving optical signals at different channel wavelengths over the trunk optical path 114. The terminals 110, 112 at each end of the WDM system 100 include one or more transmitters 120 (e.g., $TX_1$ to $TX_n$) and receivers 122 (e.g., $RX_1$ to $RX_n$) associated with different channels (e.g., Ch. 1 to Ch. n) for transmitting and receiving optical signals at the different channel wavelengths between the one or more terminals 110, 112.

Each terminal 110, 112 may include one or more transmitters 120 and receivers 122, and the transmitters 120 and receivers 122 may be separate or integrated as a transceiver within a terminal. Optical multiplexers/demultiplexers 116, 118 at each end of the WDM system 100 combine and separate the optical signals at the different channel wavelengths. Aggregate WDM optical signals including the combined channel wavelengths are carried on the trunk optical path 114.

In some embodiments, multiple transmitters 120 may be combined and implemented using a filtered laser array assembly, consistent with embodiments described herein. In other embodiments, one or more of the transmitters 120 may be tunable transmitters capable of being tuned to the appropriate channel wavelength using, for example, a filtered laser array assembly. Thus, the transmitters 120 may be constructed as universal, tunable transmitters capable of being used in different locations in the WDM system 100 and tuned to the appropriate channel wavelength depending upon the location in the WDM system 100.

Figure 2:
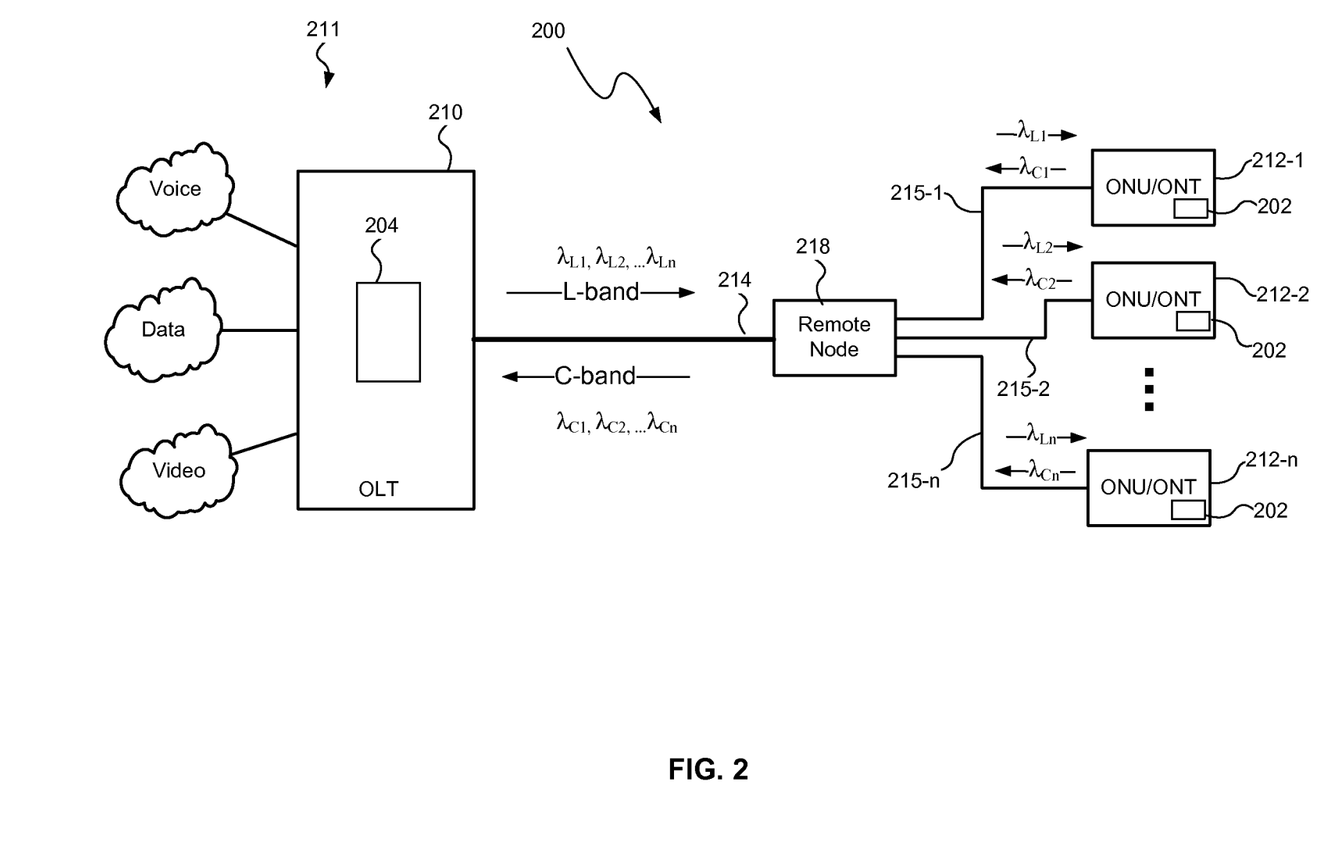
FIG. 2 is a functional block diagram of a wavelength division multiplexed (WDM) passive optical network (PON) including optical networking terminals (ONTs) and an optical line terminal (OLT) with one or more filtered laser array assemblies with external optical modulation, consistent with embodiments of the present disclosure.

Referring to FIG. 2, one or more filtered laser array assemblies 202, 204, consistent with embodiments of the present disclosure, may be used in transmitters and/or transceivers in a WDM-PON 200. The WDM-PON 200 provides a point-to-multipoint optical network architecture using a WDM system. According to one embodiment of the WDM-PON 200, a central office (CO) 211 including one or more optical line terminals (OLTs) 210 may be coupled to a plurality of optical networking terminals (ONTs) or optical networking units (ONUs) 212-1 to 212-n via optical fibers, waveguides, and/or paths 214, 215-1 to 215-n. A branching point 218 couples the trunk optical path 214 to the separate optical paths 215-1 to 215-n to the ONUs/ONTs 212-1 to 212-n at the subscriber locations. The branching point 218 may include one or more passive coupling devices such as a splitter or optical multiplexer/demultiplexer. The ONUs/ONTs 212-1 to 212-n may be located in homes, businesses or other types of subscriber location or premises.

The WDM-PON 200 may also include additional nodes or network devices, such as Ethernet PON (EPON) or Gigabit PON (GPON) nodes or devices, coupled between the branching point 218 and ONUs/ONTs 212-1 to 212-n at different locations or premises. One application of the WDM-PON 200 is to provide fiber-to-the-home (FTTH) or fiber-to-the-premises (FTTP) capable of delivering voice, data, and/or video services across a common platform. In this application, the CO 211 may be coupled to one or more sources or networks providing the voice, data and/or video.

In the WDM-PON 200, different ONUs/ONTs 212-1 to 212-n may be assigned different channel wavelengths and optical signals may be transmitted on the different channel wavelengths and combined and separated using WDM techniques. One or more of the ONUs/ONTs 212-1 to 212-n may thus include a wavelength-selectable laser array assembly 202 for generating an optical signal at a selected channel wavelength assigned for transmission. The OLT 210 may be configured to generate multiple optical signals at different channel wavelengths and to combine the optical signals into an aggregate WDM optical signal carried on the trunk optical fiber or path 214. The OLT 210 may thus include a multiplexing laser array assembly 204 for generating and combining the optical signals at multiple channel wavelengths.

In one embodiment, the WDM-PON 200 may use different wavelength bands for transmission of downstream and upstream optical signals relative to the OLT 210. For example, the L-band (e.g., about 1565 to 1625 nm) may be used for downstream transmissions and the C-band (e.g., about 1530 to 1565 nm) may be used for upstream transmissions. The ONUs/ONTs 212-1 to 212-n may thus be assigned different channel wavelengths within the L-band and within the C-band. Transceivers or receivers located within the ONUs/ONTs 212-1 to 212-n may be configured to receive an optical signal on at least one channel wavelength in the L-band. Transceivers or transmitters located within the ONUs/ONTs 212-1 to 212-n may be configured to transmit an optical signal on at least one channel wavelength in the C-band. Other wavelengths and wavelength bands are also within the scope of the system and method described herein.

In the example embodiment, the multiplexing laser array assembly 204 in the OLT 110 may generate optical signals at the different respective channel wavelengths in the L-band (e.g., $\lambda_{L1}, \lambda_{L2}, \ldots \lambda_{Ln}$). Each of the external modulators in the laser array assembly 204 may be modulated by a respective RF signal to generate the respective optical signals, and an optical multiplexer (e.g., AWG) combines the optical signals at the different respective channel wavelengths (e.g., $\lambda_{L1}, \lambda_{L2}, \ldots \lambda_{Ln}$), as will be described in greater detail below. The branching point 218 may demultiplex the downstream aggregate WDM optical signal (e.g., $\lambda_{L1}, \lambda_{L2}, \ldots \lambda_{Ln}$) from the OLT 210 for transmission of the separate channel wavelengths to the respective ONUs/ONTs 212-1 to 212-n. Alternatively, the branching point 218 may provide the aggregate WDM optical signal to each of the ONUs/ONTs 212-1 to 212-n and each of the ONUs/ONTs 212-1 to 212-n separates and processes the assigned optical channel wavelength. The individual optical signals may be encrypted to prevent eavesdropping on optical channels not assigned to a particular ONU/ONT.

In the example embodiment, the wavelength-selectable laser array assembly 202 in one or more of the ONUs/ONTs 212-1 to 212-n may generate an optical signal at a selected one or more of the channel wavelengths in the C-band (e.g., $\lambda_{C1}, \lambda_{C2}, \ldots \lambda_{Cn}$). The branching point 218 combines or multiplexes the upstream optical signals from the respective ONUs/ONTs 212-1 to 212-n for transmission as an aggregate WDM optical signal over the trunk optical path 214 to the OLT 210.

Although examples of WDM systems are illustrated, filtered laser array assemblies with external modulation, consistent with embodiments described herein, may also be used in other types of optical systems.

Figure 3:
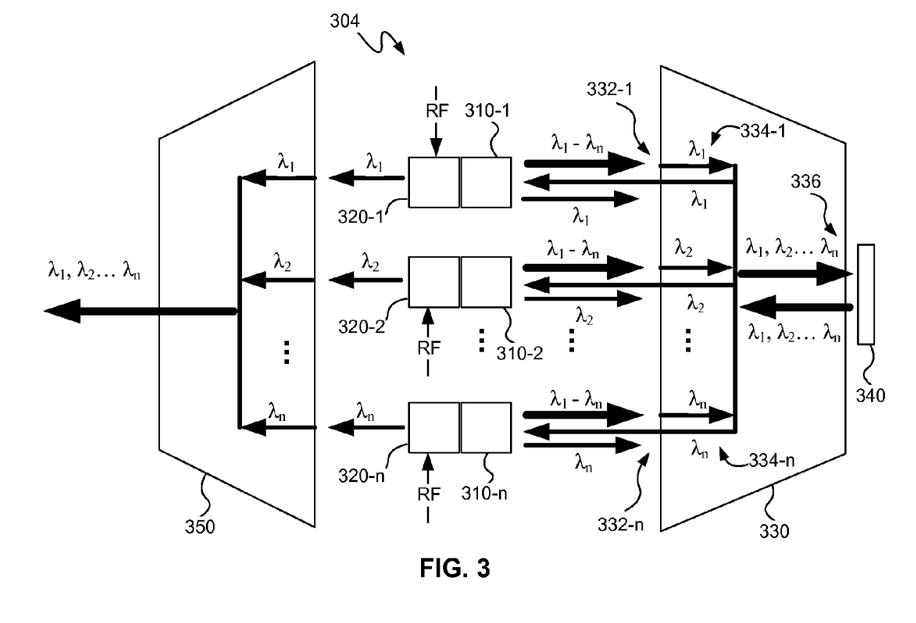
FIG. 3 is a schematic diagram of a filtered laser array assembly with external optical modulation, consistent with an embodiment of the present disclosure.

FIG. 3 illustrates a filtered laser array assembly 304 with external optical modulation, consistent with embodiments of the present disclosure, for providing multiple wavelengths or for providing a selected wavelength. The filtered laser array assembly 304 includes an array of laser emitters 310-1 to 310-n optically coupled at one end to respective input ports 332-1 to 332-n of an arrayed waveguide grating (AWG) 330 and includes a back reflector 340 coupled to an output port 336 of the optical multiplexer 330. An array of extended lasing cavities are thus integrated with the AWG 330 and formed between exit reflectors of the respective laser emitters 310-1 to 310-n and the back reflector 340. The laser emitters 310-1 to 310-n are optically coupled at a laser output end to respective external modulators 320-1 to 320-n, such as external amplitude modulators (EAMs). In the example embodiment, the outputs of the external modulators 320-1 to 320-n are coupled to an optical multiplexer 350, such as another AWG (i.e., an output AWG).

Each of the laser emitters 310-1 to 310-n is configured to emit light across a range of wavelengths including the channel wavelengths (e.g., $\lambda_1$ to $\lambda_n$) of an optical communication system. The laser emitters 310-1 to 310-n may be, for example, essentially the same laser or gain chips having essentially the same range of wavelength emission. The light emitted from one or more of the laser emitters 310-1 to 310-n across the range of wavelengths is coupled into respective input ports of the AWG 330 and passes through the respective waveguides in the AWG 330.

Each of the respective waveguides 334-1 to 334-n of the AWG 330 filters the emitted light at a different channel wavelength (e.g., $\lambda_1, \lambda_2, \ldots \lambda_n$) such that the emitted light from each of the laser emitters 310-1 to 310-n passes through the AWG 330 at the different channel wavelength. Thus, the different channel wavelengths (e.g., $\lambda_1, \lambda_2, \ldots \lambda_n$) are associated with respective input ports 332-1 to 332-n of the AWG 330 and with respective laser emitters 310-1 to 310-n coupled to those input ports. The back reflector 340 reflects the filtered light back through the AWG 330 and into a gain region of each of the respective laser emitters 310-1 to 310-n such that the extended lasing cavities lase at the respective filtered, reflected channel wavelengths. By completing the lasing cavity after the optical multiplexer 330 and lasing only at the associated channel wavelengths, the transmitters may be more efficient than transmitters including Fabry Perot (FP) lasers that lase across multiple channel wavelengths and then later filter and select a wavelength.

When lasing occurs in one or more of the extended lasing cavities, laser outputs at the associated channel wavelengths are provided from the opposite, laser output ends of the laser emitters 310-1 to 310-n and are coupled into the respective external modulators 320-1 to 320-n. Each of the laser emitters 310-1 to 310-n may be driven to provide a continuous wave (CW) laser output, and the external modulators 320-1 to 320-n modulate the CW laser output to provide modulated optical signals at the associated channel wavelength. Using the external modulators 320-1 to 320-n thus allows a higher speed modulation than directly modulating the laser emitters 310-1 to 310-n because of the length of the extended lasing cavities into the AWG 330. The modulated laser output from one or more of the external modulators 320-1 to 320-n may then pass through to the output of the optical multiplexer 350.

The filtered laser array assembly 304 may thus provide an aggregate WDM optical signal with multiplexed channel wavelengths (e.g., $\lambda_1, \lambda_2, \ldots \lambda_n$) by driving multiple ones of the laser emitters 310-1 to 310-n and modulating corresponding external modulators 320-1 to 320-n. In this embodiment, the filtered laser array assembly 304 may be used in a multiple channel transmitter (e.g., in an OLT of a WDM-PON) to transmit optical signals at multiple channel wavelengths.

The filtered laser array assembly 304 may also select a single one of the channel wavelengths (e.g., $\lambda_1, \lambda_2, \ldots \lambda_n$) for transmission, for example, by driving the laser emitter and modulating the external modulator associated with that selected channel wavelength. When the selected channel wavelength (e.g., $\lambda_2$) is associated with the laser emitter 310-2, for example, the laser emitter 310-2 is driven and the external modulator 320-2 is modulated with an RF signal to generate a modulated optical signal only at the selected channel wavelength ($\lambda_2$). In this embodiment, the filtered laser array assembly 304 may thus be used in a tunable optical transmitter (e.g., in the ONT/ONUs of a WDM-PON), allowing universal, colorless transmitters capable of changing the selected wavelength without using conventional tunable lasers.

The AWG 330 may include existing AWGs that provide the desired channel wavelengths on respective waveguides 334-1 to 334-n in the AWG, effectively filtering the light passing through the AWG 330. In one example, the AWG 330 may be a dense WDM (DWDM) AWG supporting forty (40) channels, although other AWG configurations with other numbers of channels are within the scope of the present disclosure. The external modulators 320-1 to 320-n may include external amplitude modulators (EAMs) capable of modulating at data rates higher than about 1 Gbps and at about 10 Gbps in one example. In one example, therefore, the filtered laser array assembly 304 is capable of modulating 40 channels at 10 Gbps.

The array of laser emitters 310-1 to 310-n may be coupled to the input ports of the AWG 330, for example, using a microlens array or using an optically matched laser array coupling assembly, such as a fiber tip array, as disclosed in greater detail in U.S. patent application Ser. No. 13/357,142 entitled OPTICALLY MATCHED LASER ARRAY COUPLING ASSEMBLY FOR COUPLING LASER ARRAY TO ARRAYED WAVEGUIDE GRATING, which is fully incorporated herein by reference. The back reflector 340 coupled to the output port 336 of the AWG 330 may be highly reflective (e.g., at least 80% reflective) and may include, for example, a highly reflective coating, a thin film reflector, or a fiber grating. In one embodiment, the back reflector 340 may be about 80-90% reflectivity to allow a portion of light to pass through the back for sensing by a monitor photodiode (not shown).

Figure 4:
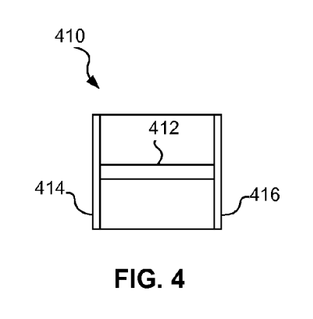
FIG. 4 is a schematic diagram of a gain chip that may be used in the filtered laser array assembly with external optical modulation.

As shown in FIG. 4, each laser emitter 410 includes a gain region 412 (e.g., a gain chip) that generates light across the range of wavelengths and amplifies the reflected light at the associated channel wavelength to provide the gain that results in lasing when the gain exceeds the cavity losses. This embodiment of the laser emitter 410 also includes an exit reflector 414 on a laser output end and an anti-reflective coating 416 on an opposite end coupled to the AWG. The exit reflector 414 reflects at least a portion of light (e.g., at the channel wavelength) from the laser emitter 410 and the anti-reflective coating 416 allows light to pass into and out of the gain region 412 of the laser emitter 410.

Each laser emitter 410 may include multiple quantum-well active regions or other gain media capable of emitting a spectrum of light across a range of wavelengths and capable of amplifying light reflected back into the gain media. The laser emitter 410 may be, for example, a gain chip such as a semiconductor diode, a reflective semiconductor optical amplifier (R-SOA), a super-luminescent light emitting diode, or other light emitting modules. In some embodiments, the laser emitter 410 may be capable of emitting a range of wavelengths across the full spectrum of channel wavelengths in a WDM optical system (e.g., the C-band, the L-band, or both) or a subset of channel wavelengths in the WDM optical system.

The exit reflector 414 may have a partial reflectivity (e.g., about 50%) sufficient to achieve lasing at the associated channel wavelength(s). The exit reflector 414 may include a reflective coating on the chip or a distributed Bragg reflector (DBR) on the gain chip or separate from the gain chip. The anti-reflective coating 416 may include a high quality anti-reflective (AR) coating on the other facet of the gain chip such that light passes out of the gain region 412 without reflection or with a reflectivity as small as possible (e.g., less than 1% reflective).

Accordingly, a filtered laser array assembly with external modulation, consistent with embodiments of the present disclosure, may be used advantageously in optical transmitters that transmit multiplexed optical signals at a plurality of channel wavelengths and/or in tunable optical transmitters that transmit optical signals at a selected channel wavelength. Using an AWG to lock in the one or more channel wavelengths avoids using complicated external wavelength locking and controls and using external modulators enables high speed optical modulation.

Consistent with an embodiment, a filtered laser array assembly includes an array of continuous wave laser emitters, each of the laser emitters including a gain region for emitting light across a range of wavelengths including a plurality of channel wavelengths and an exit reflector for reflecting at least a portion of light from the laser emitters. The filtered laser array assembly also includes an arrayed waveguide grating (AWG) including a plurality of input ports coupled to the laser emitters, respectively, and an output port. The AWG is configured to filter light received on each of the input ports at different respective channel wavelengths for each of the input ports and to provide the filtered light to the output port. A back reflector is coupled to the output port of the AWG and is configured to reflect the filtered light back to the gain region in the respective laser emitters such that lasing cavities are formed between the back reflector and the exit reflectors of respective ones of the laser emitters and lasing occurs at the channel wavelengths reflected back to the gain regions of the respective laser emitters. The filtered laser array assembly further includes a plurality of external modulators coupled to the laser emitters, respectively, and configured to modulate laser light exiting from respective ones of the laser emitters.

Consistent with another embodiment, a wavelength division multiplexed (WDM) system includes a plurality of terminals configured to transmit and receive optical signals on multiple channel wavelengths. At least one of the plurality of terminals includes a filtered laser array assembly configured to transmit a WDM optical signal at the plurality of channel wavelengths. The filtered laser array assembly includes an array of continuous wave laser emitters, each of the laser emitters including a gain region for emitting light across a range of wavelengths including a plurality of channel wavelengths and an exit reflector for reflecting at least a portion of light from the laser emitters. The filtered laser array assembly also includes an arrayed waveguide grating (AWG) including a plurality of input ports coupled to the laser emitters, respectively, and an output port. The AWG is configured to filter light received on each of the input ports at different respective channel wavelengths for each of the input ports and to provide the filtered light to the output port. A back reflector is coupled to the output port of the AWG and is configured to reflect the filtered light back to the gain region in the respective laser emitters such that lasing cavities are formed between the back reflector and the exit reflectors of respective ones of the laser emitters and lasing occurs at the channel wavelengths reflected back to the gain regions of the respective laser emitters. The filtered laser array assembly further includes a plurality of external modulators coupled to the laser emitters, respectively, and configured to modulate laser light exiting from respective ones of the laser emitters, and an optical multiplexer coupled to the external modulators.

Consistent with a further embodiment, a method is provided for transmitting modulated optical signals in a wavelength division multiplexed (WDM) system. The method includes: generating a continuous wave laser output from at least one of a plurality of laser emitters coupled to a lasing arrayed waveguide grating (AWG), wherein an extended lasing cavity is formed between an exit reflector on the at least one of the plurality of laser emitters and a back reflector coupled to an output of the AWG and includes a respective waveguide in the AWG, and wherein the extended lasing cavity is configured to lase at a channel wavelength associated with the respective waveguide in the AWG; and modulating the continuous wave laser output in at least one of a plurality of external modulators coupled to the laser emitters, respectively, to produce at least one optical signal at a corresponding channel wavelength.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A filtered laser array assembly comprising:
    an array of continuous wave laser emitters, each of the laser emitters including a gain chip for emitting light across a range of wavelengths including a plurality of channel wavelengths, an exit reflector on a laser output end of the gain chip for reflecting at least a portion of light from the gain chip, and an anti-reflective coating on an anti-reflective end of the gain chip;
    an arrayed waveguide grating (AWG) including a plurality of input ports and an output port, wherein each of the gain chips are coupled, at the anti-reflective ends, to a respective one of the input ports of the AWG, the AWG being configured to filter light received on each of the input ports at different respective channel wavelengths for each of the input ports and to provide the filtered light to the output port;
    a back reflector coupled to the output port of the AWG, the back reflector being configured to reflect the filtered light back to the gain region in the respective laser emitters such that a plurality of extended lasing cavities are formed between the back reflector and the exit reflectors of respective ones of the laser emitters, wherein the exit reflectors of each of the laser emitters are sufficiently partially reflective to achieve lasing at the associated channel wavelength, wherein each of the plurality of extended lasing cavities is completed after the AWG and is configured for lasing only at the respective channel wavelength reflected back to the respective gain region of the respective laser emitter; and
    a plurality of external modulators coupled to the laser emitters, respectively, and configured to modulate laser light exiting from respective ones of the laser emitters.

2. The filtered laser array assembly of claim 1 wherein the back reflector is highly reflective.

3. The filtered laser array assembly of claim 1 wherein the laser emitters include reflective-semiconductor-optical-amplifiers (R-SOAs).

4. The filtered laser array assembly of claim 1 wherein the external modulators include external amplitude modulators (EAMs).

5. The filtered laser array assembly of claim 1 further comprising an optical multiplexer coupled to the external modulators.

6. The filtered laser array assembly of claim 5 wherein the optical multiplexer is an arrayed waveguide grating (AWG).

7. The filtered laser array assembly of claim 1 wherein the array of laser emitters is configured to emit light from a selected one of the laser emitters such that lasing occurs at a corresponding selected channel wavelength.

8. The filtered laser array assembly of claim 1 wherein the array of laser emitters is configured to emit light from each of the laser emitters such that lasing occurs at a plurality of channel wavelengths.

9. The filtered laser array assembly of claim 1 wherein the plurality of wavelengths include wavelengths in the L-band or in the C-band.

10. The filtered laser array assembly of claim 1 wherein the external modulators are configured to modulate the laser outputs at a rate of at least 1 Gbps.

11. A wavelength division multiplexed (WDM) system comprising:
    a plurality of terminals configured to transmit and receive optical signals on multiple channel wavelengths, at least one of the plurality of terminals comprising a filtered laser array assembly configured to transmit a WDM optical signal at the plurality of channel wavelengths, the filtered laser array assembly comprising:
        an array of continuous wave laser emitters, each of the laser emitters including a gain chip for emitting light across a range of wavelengths including a plurality of channel wavelengths, an exit reflector on a laser output end of the gain chip for reflecting at least a portion of light from the gain chip, and an anti-reflective coating on an anti-reflective end of the gain chip;
        an arrayed waveguide grating (AWG) including a plurality of input ports and an output port, wherein each of the gain chips are coupled, at the anti-reflective ends, to a respective one of the input ports of the AWG, the AWG being configured to filter light received on each of the input ports at different respective channel wavelengths for each of the input ports and to provide the filtered light to the output port;
        a back reflector coupled to the output port of the AWG, the back reflector being configured to reflect the filtered light back to the gain region in the respective laser emitters such that a plurality of extended lasing cavities are formed between the back reflector and the exit reflectors of respective ones of the laser emitters, wherein the exit reflectors of each of the laser emitters are sufficiently partially reflective to achieve lasing at the associated channel wavelength, wherein each of the plurality of extended lasing cavities is completed after the AWG and is configured for lasing only at the respective channel wavelength reflected back to the respective gain region of the respective laser emitter;
        a plurality of external modulators coupled to the laser emitters, respectively, and configured to modulate laser light exiting from respective ones of the laser emitters; and
        an optical multiplexer coupled to the external modulators.

12. The WDM system of claim 11 wherein the at least one of the terminals includes an optical line terminal (OLT) in a WDM passive optical network (PON) and configured to transmit the WDM optical signal including the channel wavelengths, and wherein others of the plurality of terminals include optical networking terminals (ONTs) configured to receive optical signals at respective ones of the channel wavelengths in the WDM-PON.

13. The WDM system of claim 11 wherein others of the plurality of terminals are associated with different channel wavelengths, and further comprising:
at least one branching point coupled between the at least one of the plurality of terminals and others of the plurality of terminals, the branching point being configured to separate the WDM optical signal into optical signals at the channel wavelengths; and
a trunk optical path coupling the at least one of the plurality of terminals and the branching point.

14. The WDM system of claim 11 wherein the optical multiplexer is an arrayed waveguide grating (AWG).

15. The WDM system of claim 11 wherein the plurality of wavelengths include wavelengths in the L-band.

16. The WDM system of claim 11 wherein the plurality of terminals include optical networking terminals (ONTs) in a WDM passive optical network (PON).

17. A method of transmitting modulated optical signals in a wavelength division multiplexed (WDM) system, the method comprising:
generating a continuous wave laser output from at least one of a plurality of laser emitters coupled to a lasing arrayed waveguide grating (AWG), wherein each of the laser emitters include a gain chip with an exit reflector on an output end of the gain chip and an anti-reflective coating on an anti-reflective end of the gain chip, wherein each of the gain chips are coupled, at the anti-reflective ends, to an input port of the AWG such that a plurality of extended lasing cavities are formed between the exit reflectors on the plurality of laser emitters and a back reflector coupled to an output of the AWG and the plurality of extended lasing cavities include respective waveguides in the AWG, and wherein each of the plurality of the extended lasing cavities is completed after the AWG and configured to lase only at a respective channel wavelength associated with the respective waveguide in the AWG; and
modulating the continuous wave laser output in at least one of a plurality of external modulators coupled to the laser emitters, respectively, to produce at least one optical signal at a corresponding channel wavelength.

18. The method of claim 17 wherein the continuous wave laser output is generated from multiple ones of the plurality of laser emitters and is modulated in multiple respective ones of the external modulators to produce multiple optical signals at different channel wavelengths, further comprising multiplexing the multiple optical signals to produce an aggregate WDM optical signal.

19. The method of claim 18 wherein the multiple optical signals are multiplexed in an output AWG.

20. The method of claim 17 wherein the channel wavelengths include wavelengths in the C-band or in the L-band.

21. The method of claim 17 wherein the continuous wave laser output is modulated at a rate of at least 1 Gbps.

* * * * *